(12) United States Patent
Gu et al.

(10) Patent No.: US 8,618,670 B2
(45) Date of Patent: Dec. 31, 2013

(54) CORROSION CONTROL OF STACKED INTEGRATED CIRCUITS

(75) Inventors: Shiqun Gu, San Diego, CA (US); Matthew Nowak, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 281 days.

(21) Appl. No.: 12/192,514

(22) Filed: Aug. 15, 2008

(65) Prior Publication Data

US 2010/0038801 A1 Feb. 18, 2010

(51) Int. Cl.
*H01L 23/20* (2006.01)
*H01L 21/58* (2006.01)

(52) U.S. Cl.
USPC .......... 257/777; 257/686; 257/E23.013; 257/E25.006; 257/E25.013; 257/E25.018; 257/E25.021; 257/E21.499; 257/E21.573

(58) Field of Classification Search
USPC .......... 257/686, 777, E23.013, E25.006, 257/E25.013, E25.018, E25.021, E21.499, 257/E21.573
See application file for complete search history.

(56) References Cited

U.S. PATENT DOCUMENTS

| | | | | |
|---|---|---|---|---|
| 4,710,798 A | * | 12/1987 | Marcantonio | 257/777 |
| 5,354,714 A | * | 10/1994 | Boysel | 438/127 |
| 5,448,114 A | | 9/1995 | Kondoh et al. | |
| 5,578,874 A | * | 11/1996 | Kurogi et al. | 257/778 |
| 5,981,388 A | | 11/1999 | Miyamoto | |
| 6,297,072 B1 | | 10/2001 | Tilmans | |
| 6,313,529 B1 | | 11/2001 | Yoshihara et al. | |
| 6,405,592 B1 | * | 6/2002 | Murari et al. | 73/493 |
| 6,498,422 B1 | * | 12/2002 | Hori | 310/344 |
| 7,154,206 B2 | * | 12/2006 | Shimada et al. | 310/313 R |
| 2002/0000646 A1 | | 1/2002 | Gooch et al. | |
| 2003/0148590 A1 | | 8/2003 | Kellar et al. | |
| 2003/0214029 A1 | | 11/2003 | Tao et al. | |
| 2004/0159960 A1 | * | 8/2004 | Fujiwara et al. | 257/783 |
| 2004/0259325 A1 | | 12/2004 | Gan | |
| 2005/0109455 A1 | | 5/2005 | Bai | |
| 2006/0001177 A1 | * | 1/2006 | Hubner | 257/777 |
| 2006/0043604 A1 | | 3/2006 | Suga | |

(Continued)

FOREIGN PATENT DOCUMENTS

DE 102006046820 5/2007
JP 59088864 A 5/1984

(Continued)

OTHER PUBLICATIONS

International Search Report—PCT/US2009/053895, International Search Authority—European Patent Office Nov. 3, 2009.

(Continued)

*Primary Examiner* — Peniel M Gumedzoe
(74) *Attorney, Agent, or Firm* — Michelle S. Gallardo

(57) ABSTRACT

A system and method prevent corrosive elements (or at least the oxidizing agent) from making contact with metal connections at the interface between two layers of a stacked IC device. When layers are positioned in proximity to each other, a cavity is formed at the boundary of the planar surfaces of the layers. This cavity is bounded by a peripheral seal between the layers. In one embodiment, a vacuum is created within the cavity thereby reducing the corrosive atmosphere within the cavity. In another embodiment, the cavity is filled with an inert gas, such as argon. Once the cavity has oxidizing elements reduced, the peripheral seal can be encapsulated to prevent seepage of contaminants into the cavity.

26 Claims, 5 Drawing Sheets

(56) References Cited

U.S. PATENT DOCUMENTS

| | | |
|---|---|---|
| 2006/0170089 A1* | 8/2006 | Mizukoshi .................... 257/686 |
| 2006/0216857 A1 | 9/2006 | Zhao |
| 2007/0080467 A1* | 4/2007 | Kurita .......................... 257/777 |
| 2008/0006938 A1 | 1/2008 | Patti et al. |

FOREIGN PATENT DOCUMENTS

| | | |
|---|---|---|
| JP | 6037143 A | 2/1994 |
| JP | 11067820 A | 3/1999 |
| JP | 2004153579 A | 5/2004 |
| JP | 2004207674 A | 7/2004 |
| JP | 2006186091 A | 7/2006 |
| JP | 2007020073 A | 1/2007 |
| JP | 2007512707 A | 5/2007 |
| JP | 2007149816 A | 6/2007 |
| JP | 2008112835 A | 5/2008 |
| WO | 0156921 | 8/2001 |
| WO | WO-2005055311 A2 | 6/2005 |

OTHER PUBLICATIONS

Written Opinion—PCT/US2009/053695, International Search Authority—European Patent Office Nov. 3, 2009.
Taiwan Search Report—TW098127471—TIPO—Sep. 6, 2012.

* cited by examiner

CORROSION CONTROL OF STACKED INTEGRATED CIRCUITS

TECHNICAL FIELD

This disclosure relates to integrated circuits (ICs) and more specifically to multi-layered ICs and even more specifically to systems and methods for controlling corrosion between layers.

BACKGROUND

In IC technology there is a need to stack chips (dies) together to form multi-layered (3-D) IC devices. One method to form a 3-D device is to bring two (or more) layers together and then encapsulate the layers into a single structure. Electrical conductors and/or contacts on the surfaces of the respective layers serve to carry electrical signals between circuits on the different layers. These conductors/contacts are very small, on the order of microns in diameter, and when exposed to a corrosive atmosphere will corrode relatively quickly. Corrosion then interferes with the signal processing capability of the 3D devices.

The corrosion results from a small gap created between the two dies when they are brought together. Corrosive material, such as water and oxygen can be trapped within these gaps. This trapped corrosive material then interacts with the metallic conductors/contacts resulting in reliability problems.

One solution is to fill the "gap" with filler material. Because the gap size is not constant, the amount at filler is not constant. Thus, it is difficult to completely fill the gap. On the other hand, using too much filler will increase the size of the resultant 3-D device, thereby changing the form factor.

Another solution is to eliminate the gap or make it very small. To accomplish this, the surfaces of the respective dies would have to be extremely planar, thereby adding to the cost of the device, as well as to the cost of handling the dies.

An additional problem is that gases trapped between the layers expand during temperature increases or external pressure decreases. The expanded gases exert separation pressure on the bonded tier.

BRIEF SUMMARY

The present disclosure is directed to systems and methods for preventing corrosive elements (e.g., oxidizing agents) from contacting metal connections at the interface between two layers of a stacked IC device. When layers are positioned in proximity to each other, a cavity is formed at the boundary of the planar surfaces of the layers. This cavity is bounded by a peripheral seal between the layers. In one embodiment, a vacuum is created within the cavity, thereby eliminating or reducing the corrosive atmosphere within the cavity. In another embodiment, the cavity is filled with a non-oxidizing gas, such as argon. Once the cavity is free of oxidizing elements, the peripheral seal can be encapsulated to prevent seepage of contaminants into the cavity and to prevent corrosion of the seal itself.

The foregoing has outlined rather broadly the features and technical advantages of the present invention in order that the detailed description of the invention that follows may be better understood. Additional features and advantages will be described hereinafter which form the subject of the claims of the invention. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
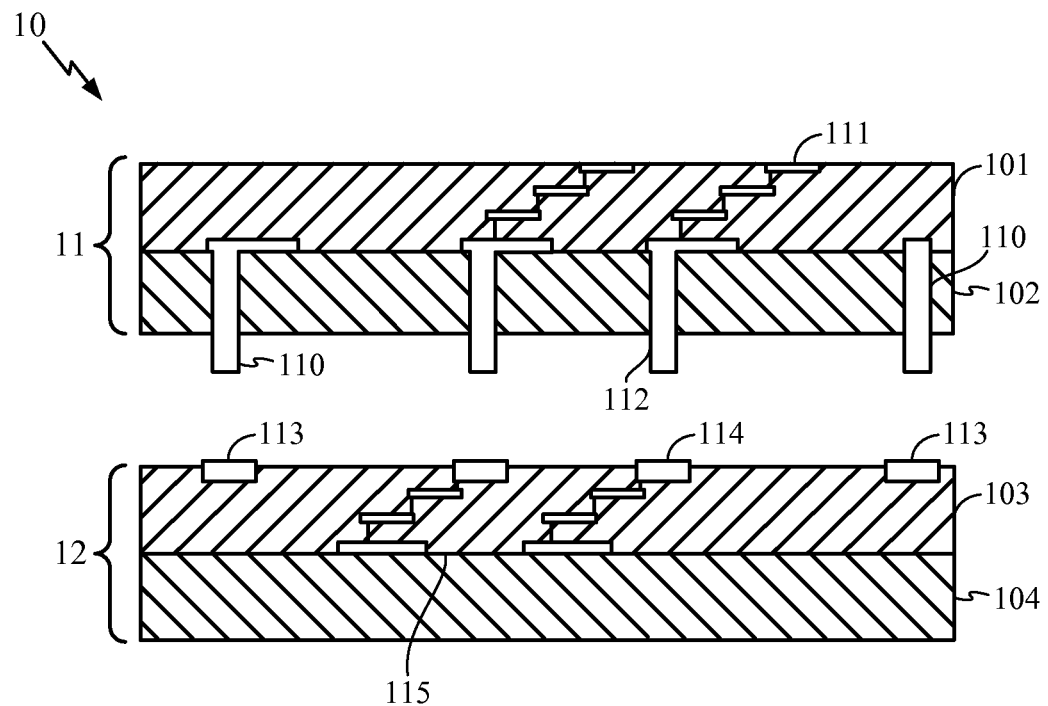
FIGS. 1A through 1C show examples of a multi-layered IC devices and exemplary processes for manufacturing the multi-layered IC devices in accordance with embodiments of the invention.

Turning now to FIG. 1A, there is shown stacked IC device 10 which comprises top die 11 and bottom die 12. Top die 11 has active layer 101 and substrate layer 102. Bottom die 12 has active layer 103 and substrate layer 104. FIG. 1A shows the top die and bottom die positioned prior to being brought together for bonding purposes. In this embodiment, substrate layer 102 will be bonded to active layer 103 and thus this is a "back-to-face" bonding arrangement. As will be discussed, any arrangement of "face-to-face," "back-to-back," "face-to-back," or "back-to-face" combinations can use the concepts discussed herein to form tiered semi-conductor components.

Figure 1B:
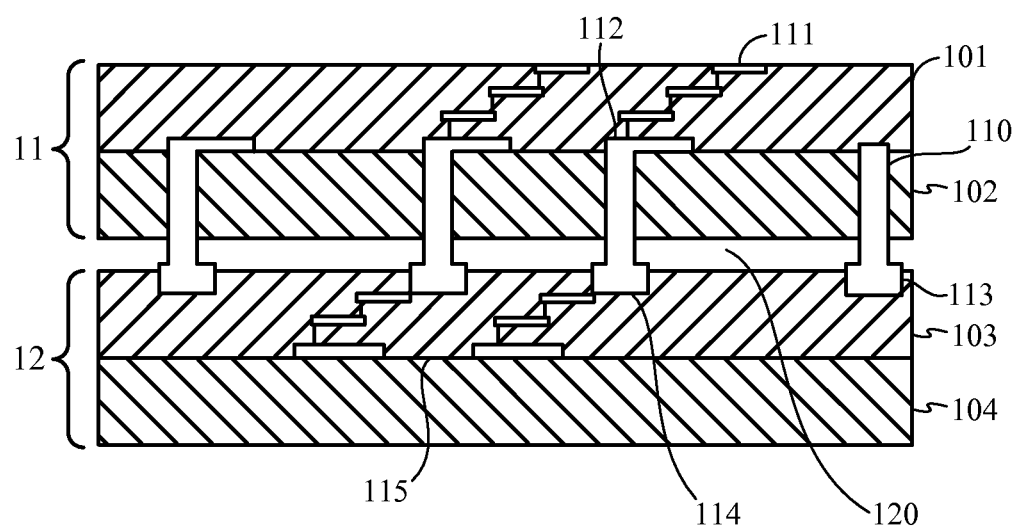
Figure 1C:
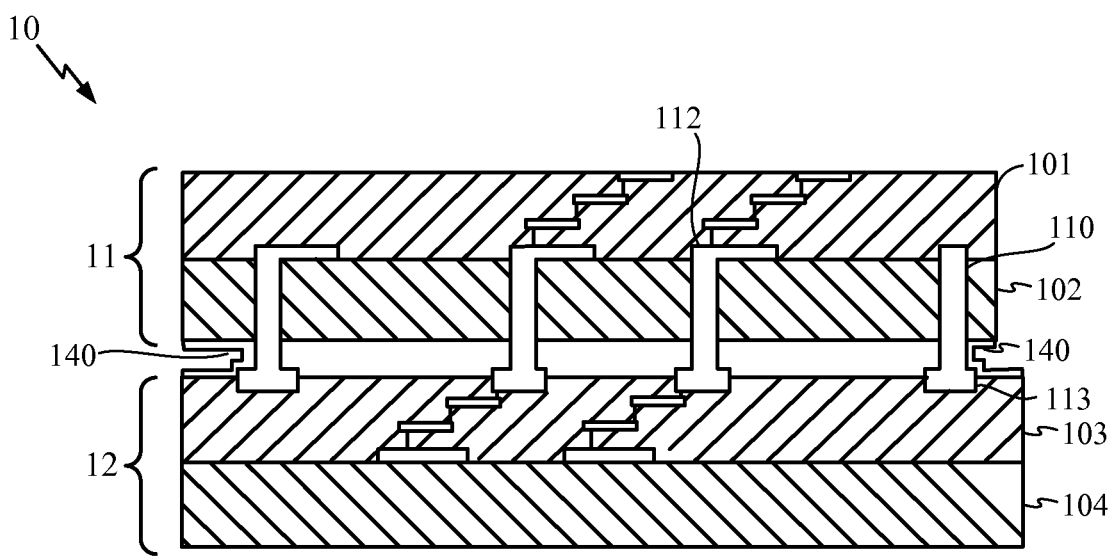

FIG. 1A-1C depict a two layered stacked IC device, however a stacked IC device may comprise more layers. Substrate layer 102 contains connections (elements) 112 which serve to connect components 111 (or terminals) on layer 101 to active components 115 (or terminals) on layer 103. These connections are made using connector path 112 which then mates with pad 114 on a planar surface of layer 103, when the planar surfaces of layers 102 and 103 are brought together. Around the periphery of top die 11 and bottom die 12 there are formed elements 110 and 113, respectively, which will come together to form a seal (as will be seen) when the layers are mated. In the embodiment shown, seal portions 110 and 113 are metal, but may comprise other materials.

FIG. 1B shows dies 11 and 12 coming together, and forming one or more gaps 120 within the area bounded by the peripheral mated elements 110/113. Elements 110/113 come together to form a seal around the periphery. Note that now an electrical connection exists from component 111 to component 115 using connector elements 112 and 114.

Once the elements are properly aligned, a new atmosphere can be selectively created in an environmentally controlled chamber such that the new atmosphere is different from the atmosphere that would normally be formed if atmospheric intervention is not undertaken, e.g., ambient atmosphere. For example, a normal atmosphere could contain water, other vapors, and/or other gases that could cause corrosion which in turn would cause interference with the proper operation of the IC device.

In such an example, the selectively created non-corrosive environment created within the environmentally controlled chamber may be created, by way of example, using a pump (not shown) to reduce the atmospheric pressure in the environmentally controlled chamber and/or to substantially replace the atmosphere within the environmentally controlled chamber with an inert gas or non-oxygen gas, as will be discussed. The created atmosphere is designed to drive out the oxygen, water, and/or other oxidizing agents thereby reducing corrosion. Once the proper environment is created, the dies are compressed together and bonded, preferably at a temperature in air greater than 150 degrees Centigrade so that the proper environment exists in the gap 120.

Note that the low pressure can be created by using one or more pumps. These pumps may also be used to inject a desired environment, such as argon or nitrogen into the environmentally controlled chamber, instead of or in addition to reducing the pressure. The low pressure could be as low as desired even to the point of substantially creating a vacuum.

Also note that in some situations it might be desirable to create more than one gap between the layers and to create different environments with respect to different gaps. The gaps may be created by placing mated elements 110/113 around the portions that are desired to be separate gaps. Thus, a low pressure could be created with respect to some gaps and a different environment created in other gaps within the same stacked IC device. These different environments can be between the same layers and/or between different layers.

FIG. 1C shows the addition of protective layer 140 outside of seal 110/113. This protective layer can be added, for example, by plasma enhanced chemical vapor deposition (PCVD) to help prevent the environment inside the sealed cavity from having contact with corrosive elements, such as water or oxygen, found in the normal environment. Layer 140 could be an insulated layer, such as silicon nitrite or silicon oxide. The film 140 can be deposited all around the exterior of the stacked IC device, if desired, rather than solely on the seal ring 110/113, as shown in FIG. 1C. A function of this layer 140 is to form a barrier between the seal ring 110/113 and its external environment. Protective layer 140 is created because it is unlikely that metal seal 110/113 could be tight enough around the total perimeter to form a perfect impervious bond without some leakage. Moreover, if the seal 110/113 is formed of metal, the seal 110/113 could corrode.

Figure 2:
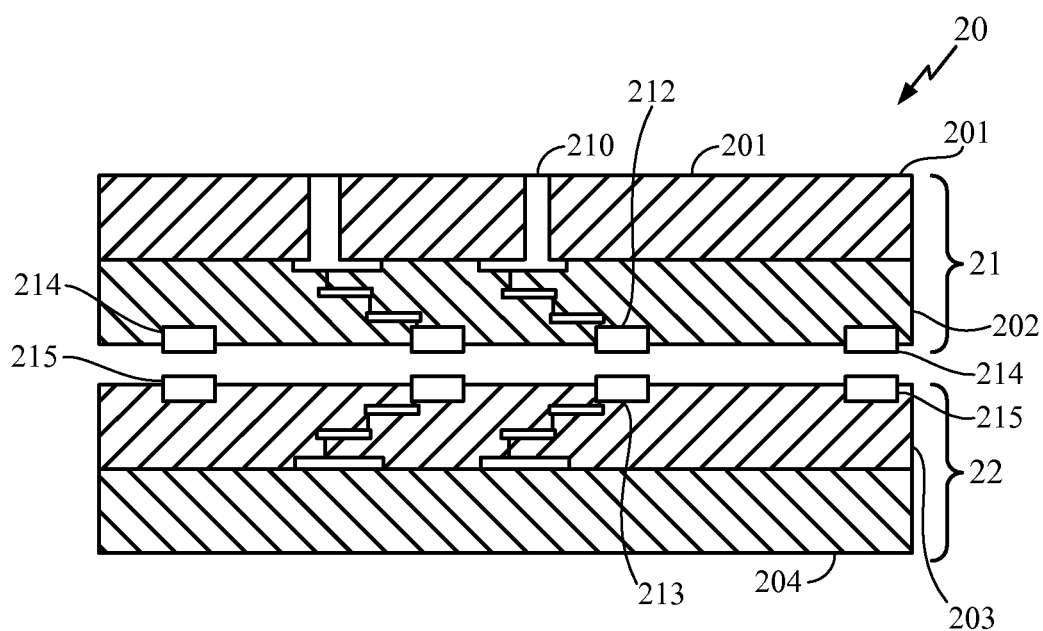
FIG. 2 shows one alternate stacked IC device, according to embodiments of the invention.

FIG. 2 shows one alternate stacked IC device arrangement 20 having dies 21 and 22 and in which the "faces" 202, 203 of at least two of the layers are bonded in a "face-to-face" relationship. This is in contrast to the "back-to-face" bonding shown in FIGS. 1A through 1C. In FIG. 2, stacked IC device 20 has layer to layer electrical contacts 212, 213 with vias 210 (if necessary) to provide connectivity to external components. Note that the metallic peripheral seal ring between the layers is, in this embodiment, made up by portions 214 and 215. Of course, any combination and any number of layers can be used.

Figure 3:
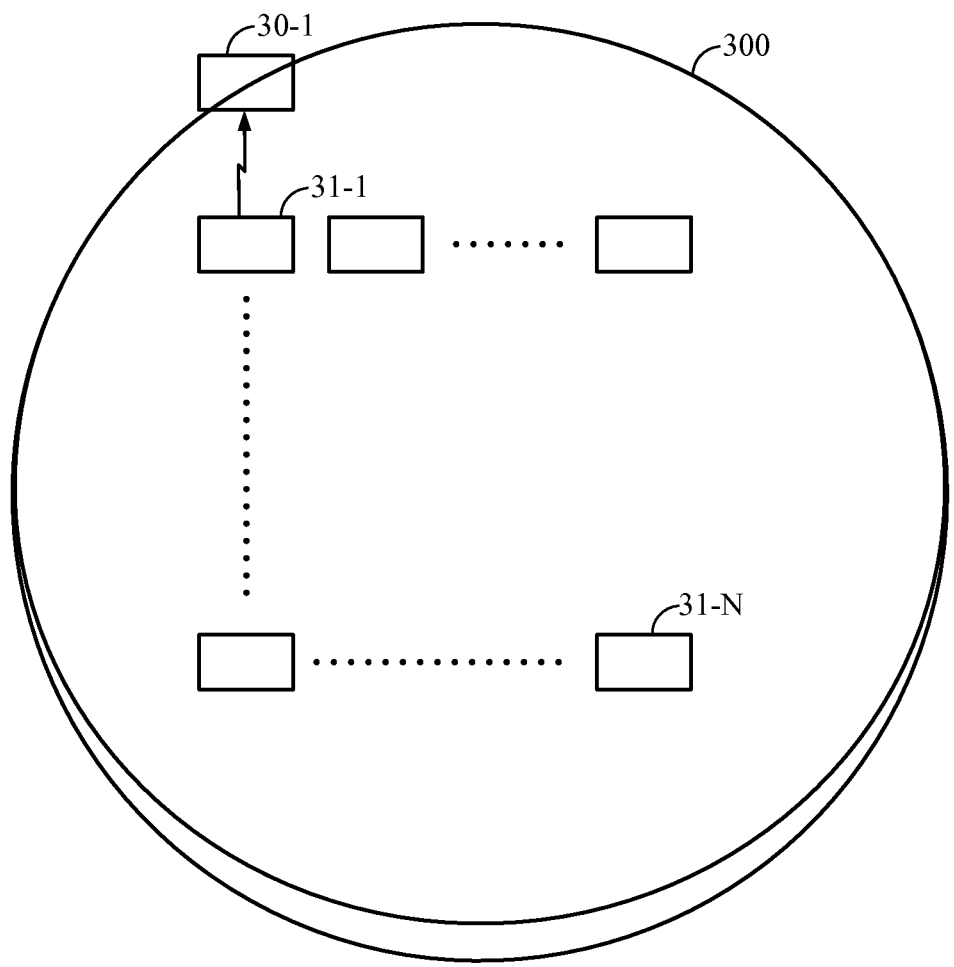
FIG. 3 shows one embodiment of die to wafer stacking, according to embodiments of the invention.

The concepts discussed herein can be accomplished with die to die stacking, die to wafer stacking and, in some situations, wafer to wafer stacking. FIG. 3 shows die to wafer stacking in which die 30-1 is mated to die 31-1 which is still part of wafer 300. Dies 30-1 and 31-1 may have different sizes. This can be repeated sequentially or in parallel with any number of other dies (not shown) bonded to any of dies 31-1 to 31-N-positioned on wafer 300. Encapsulation (not shown in FIG. 3) can then occur with respect to one die pair, or with respect to all die pairs, to provide the protective outer seal. Dies 31-1 to 31-N can then be separated from wafer 300 to form individual stacked IC devices.

Figure 4:
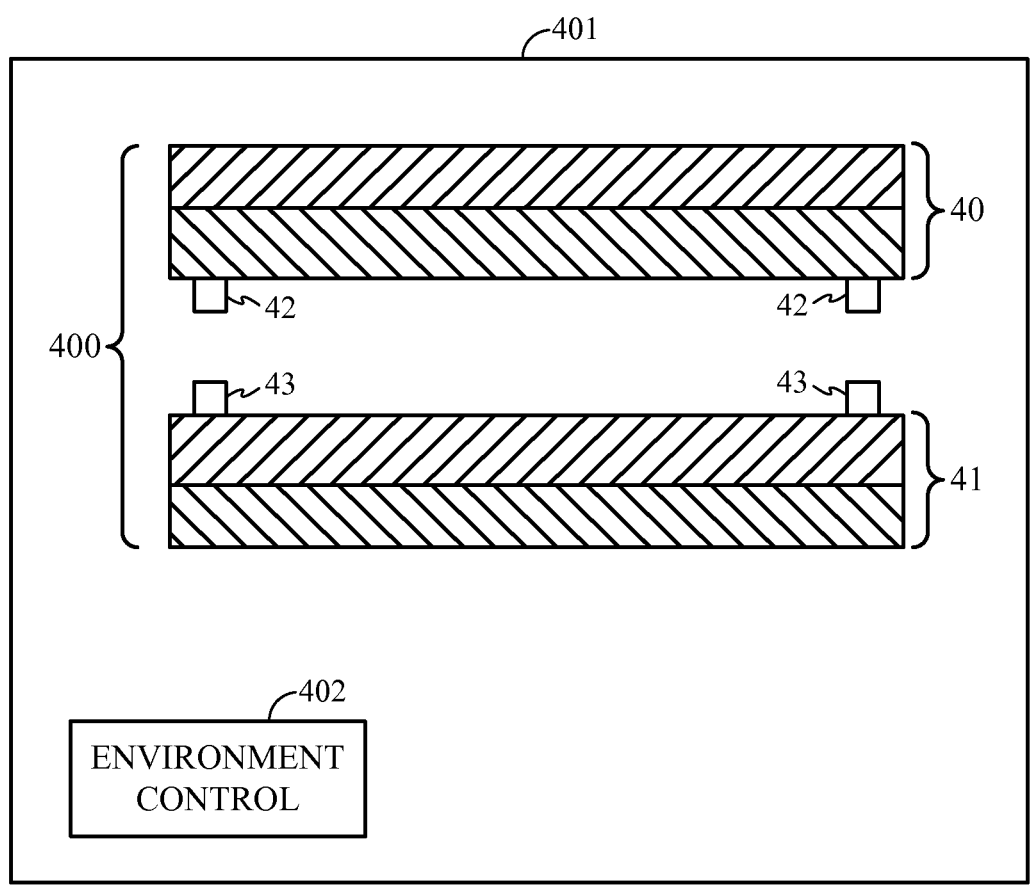
FIG. 4 shows one alternative embodiment in which multi-layered IC devices are bonded in an environmentally controlled chamber, according to embodiments of the invention.

FIG. 4 shows one alternative embodiment in which a multi-layered IC device is bonded in an environmentally controlled chamber. As shown, die 40 is positioned in conjunction with die 41 to form stacked IC device 400 within chamber 401. Dies 40 and 41 are properly aligned and then environment control 402 creates the proper environment using rings 42 and 43 to form the seal around the periphery between the layers. This environment, for example, can be low pressure (including a vacuum if desired) or the environment can be a gas, such as nitrogen or argon or any other substance, or combination of substances that prevent or reduce corrosive, or other undesired effects, within the cavity between the mated layers. Argon Stacked IC device 400 is preferably heated to a temperature of 130C to 400C so that when the stacked IC device 400 cools, the gap between the tiers is under lower than atmospheric pressure. While heated, compression thermal bonding can then be used to bond dies 40 and 41. Once the layers are bonded, the protective film (not shown) can be deposited over the entire stacked IC device 400, or if desired, only around the inter-layer seal ring 42/43. Note that the reduced pressure within the cavity, resulting from heating the layers before bonding, acts to facilitate holding the layers together. Moreover, if the temperature rises, the pressure within the cavity (cavities) will not be sufficient to push the layers apart.

Figure 5:
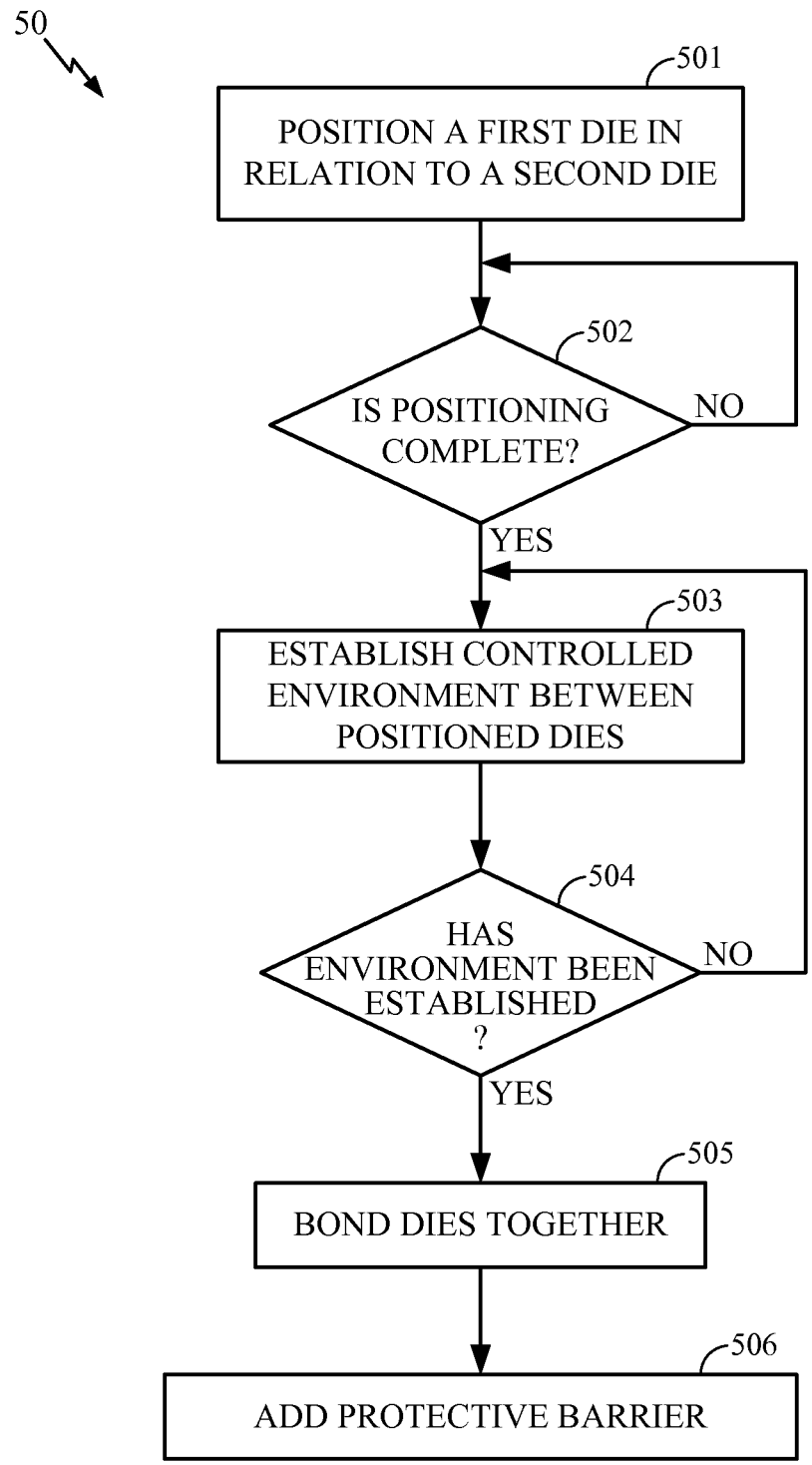
FIG. 5 shows one embodiment of a method for controlling corrosion between layers of a multi-layered IC device, according to embodiments of the invention.

FIG. 5 shows one embodiment 50 of a method for controlling corrosion between layers of a multi-layered IC device. Block 501 controls the positioning of one or more dies in relation to a second die (or wafer). When block 502 determines that the positioning is complete, such that the peripheral seal (for example, 214/215 FIG. 2) is established, block 503 establishes a controlled environment between the dies in any one of a number of ways, such as discussed above, or otherwise.

Blocks 503 and 504 repeat until block 504 determines the proper environment has been established, in which case block 505 bonds the dies together. If desired, block 506 adds the protective barrier outside the established seal as discussed above.

Although blocks 501 and 502 are shown before blocks 503 and 504, it is envisioned that blocks 503 and 504 could occur prior to blocks 501 and 502. It should be appreciated that while the seal is shown around the periphery, the seal can be around only certain elements and more than one sealed area can be formed between two layers.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A tiered semi-conductor device comprising:
   first and second tiers bonded to each other along planar surfaces of said tiers, each of said tiers comprising at least one active element;
   an environmental seal around a periphery of the planar surfaces;
   connector elements for electrically coupling the first and second tiers, all of the connector elements located within an area bounded by the environmental seal; and
   a protective insulator formed on an outer edge of the environmental seal, a first portion of the protective insulator extending from the environmental seal toward the planar surface of the first tier and a second portion of the protective insulator extending from the environmental seal toward the planar surface of the second tier to define a space between the planar surfaces, in which sidewalls of the first and second portions of the protective insulator are flush with sidewalls of the first tier and the second tier.

2. The device of claim 1 further comprising a substantially non-corrosive environment between said bonded planar surfaces within the area bounded by said seal.

3. The device of claim 2 wherein said substantially non-corrosive environment comprises an inert gas.

4. The device of claim 2, in which the substantially, non-corrosive environment comprises reduced atmospheric pressure.

5. The device of claim 1, in which the protective insulator comprises one of silicon nitride and silicon oxide.

6. The device of claim 1, in which the protective insulator comprises a conformal plasma enhanced chemical vapor deposition (PECVD) film.

7. The device of claim 2 wherein said tiers are dies.

8. The device of claim 2 wherein said first tier is a die and said second tier is a wafer.

9. A method for constructing a tiered semi-conductor device, said method comprising:
   bringing planar surfaces of a first and a second tier of said semi-conductor device together for bonding;
   creating a controlled environment between said planar surfaces of said first and second tiers;
   maintaining said controlled environment after said planar surfaces are bonded with an environmental seal around a periphery of the planar surfaces;
   electrically coupling the first and second tiers with connector elements, all of the connector elements located within an area bounded by the environmental seal; and
   depositing a protective insulator on an exterior edge of the environmental seal, a first portion of the protective insulator extending from the environmental seal toward the planar surface of the first tier and a second portion of the protective insulator extending from the environmental seal toward the planar surface of the second tier to define a space between the planar surfaces, in which sidewalls of the first and second portions of the protective insulator are flush with sidewalls of the first tier and the second tier.

10. The method of claim 9 in which said creating comprises:
    creating a low atmospheric pressure.

11. The method of claim 9 in which the environmental seal comprises:
    material resident on each of said planar surfaces prior to when said planar surfaces are bonded.

12. The method of claim 9 wherein said creating comprises:
    adding a non-oxygen gas between said planar surfaces.

13. The method of claim 12 wherein said gas is selected from the list of:
    argon, nitrogen, and forming gas.

14. A stacked IC device comprising:
    a first die having thereon a first set of IC elements, said first die having at least one surface at which said first set of IC elements are formed;
    a second die having thereon a second set of IC elements, said second die having at least one surface at which said second set of IC elements are formed;
    at least one seal element formed on said at least one surface of each of said dies wherein said at least one surface of each of said dies are bonded together such that said at least one seal element is brought together to seal an environment around all of the IC elements; and
    a protective insulator formed on an outer edge of the at least one seal element so as to maintain the environment, a first portion of the protective insulator extending from the at least one seal element toward a surface of the at least one surface of the first die and a second portion of the protective insulator extending from the at least one seal element toward a surface of the at least one surface of the second die to define a space between the surfaces of the first and second die, in which sidewalls of the first and second portions of the protective insulator are flush with sidewalls of the first die and the second die.

15. The stacked IC device of claim 14 further comprising:
    a selectively created atmosphere within said sealed environment.

16. The stacked IC device of claim 15 in which said created atmosphere is a modification of an ambient atmosphere.

17. The stacked IC device of claim 16 wherein said at least one seal element comprises conductive portions located around a circumference of said sealed environment.

18. The stacked IC device of claim 15 wherein said selectively created atmosphere is selected from the list of: low atmospheric pressure, and nonoxygen gas.

19. The device of claim 14, in which the protective insulator comprises one of silicon nitride and silicon oxide.

20. A method of constructing a stacked IC device, said method comprising:
    positioning a first die in relationship to a second die;
    establishing a controlled environment between a planar surface of said first die and a planar surface of said second die;
    bonding said first and second dies to form the stacked IC device;
    maintaining the controlled environment with an environmental seal around a periphery of the planar surfaces;
    electrically coupling the first and second dies with connector elements, all of the connector elements located within an area bounded by the environmental seal; and
    forming a protective insulator on an outer edge of the environmental seal, a first portion of the protective insulator extending from the environmental seal toward the planar surface of the first die and a second portion of the protective insulator extending from the environmental seal toward the planar surface of the second die to define a space between the planar surfaces, in which sidewalls of the first and second portions of the protective insulator are flush with sidewalls of the first die and the second die.

21. The method of claim 20, wherein said establishing further comprises:
reducing atmospheric pressure within said controlled environment.

22. The method of claim 20, wherein said establishing further comprises:
injecting a non-oxygen gas within said controlled environment.

23. The method of claim 20, wherein said bonding comprises:
raising a temperature of said dies while compressing said first and second dies together.

24. The method of claim 20 in which said second die is contained on a wafer having thereon a plurality of dies.

25. A tiered semi-conductor device comprising:
first and second tiers bonded to each other along planar surfaces of the tiers, each of the tiers comprising at least one active element.
means for environmentally sealing an area between the planar surfaces;
means for electrically coupling the first and second tiers, all of the coupling means located within an area bounded by the sealing means; and
means for insulating the coupling means, the insulating means being formed on an outer edge of the sealing means, a first portion of the insulating means extending from the sealing means toward planar surface of the first tier and a second portion of the insulating means extending from the sealing means toward the planar surface of the second tier to define a space between the planar surfaces, in which sidewalls of the first and second portions of the insulating means are flush with sidewalls of the first tier and the second tier.

26. A stacked IC device comprising:
a first die having thereon a first set of IC elements, the first die having at least one surface at which the first set of IC elements are formed;
a second die having thereon a second set of IC elements, the second die having at least one surface at which the second set of IC elements are formed;
means for environmentally sealing the IC elements, the sealing means formed on the at least one surface of each of the dies, in which the at least one surface of each of the dies are bonded together such that the sealing means are brought together to seal an environment around all of the IC elements; and
means for insulating the IC elements, the insulating means being formed on an outer edge of the sealing means so as to maintain the environment , a first portion of the insulating means extending from the sealing means toward a surface of the at least one surface of the first die and a second portion of the insulating means extending from the sealing means toward a surface of the at least one surface of the second die to define a space between the surfaces of the first and second die, in which sidewalls of the first and second portions of the insulating means are flush with sidewalls of the first die and the second die.

* * * * *